(12) United States Patent
Lin

(10) Patent No.: US 7,592,229 B2
(45) Date of Patent: Sep. 22, 2009

(54) METHOD FOR FABRICATING A RECESSED-GATE MOS TRANSISTOR DEVICE

(75) Inventor: Shian-Jyh Lin, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 521 days.

(21) Appl. No.: 11/460,992

(22) Filed: Jul. 30, 2006

(65) Prior Publication Data

US 2007/0161172 A1 Jul. 12, 2007

(30) Foreign Application Priority Data

Jan. 9, 2006 (TW) .............................. 95100809 A

(51) Int. Cl.
*H01L 21/336* (2006.01)
(52) U.S. Cl. .............................. 438/272; 257/E29.201; 257/E21.55
(58) Field of Classification Search ................ 438/272; 257/E21.55, E29.201
See application file for complete search history.

(56) References Cited

U.S. PATENT DOCUMENTS

| 6,153,482 | A * | 11/2000 | Su et al. ...................... 438/297 |
| 6,372,591 | B1 * | 4/2002 | Mineji et al. ................. 438/305 |
| 6,960,507 | B2 * | 11/2005 | Kim et al. .................... 438/270 |
| 7,470,588 | B2 * | 12/2008 | Cho et al. .................... 438/272 |
| 2004/0110383 | A1 * | 6/2004 | Tanaka ........................ 438/700 |
| 2006/0040446 | A1 * | 2/2006 | Hsieh .......................... 438/257 |
| 2007/0059897 | A1 * | 3/2007 | Tilke et al. .................. 438/424 |

* cited by examiner

*Primary Examiner*—Thao X Le
*Assistant Examiner*—Ajay K. Arora
(74) *Attorney, Agent, or Firm*—Winston Hsu

(57) ABSTRACT

A method for fabricating a recessed-gate transistor is disclosed. A trench is recessed into a substrate. A poly/nitride spacer is formed on sidewalls of the trench. A trench bottom oxide is formed. The spacer is then stripped off. A source/drain doping region is formed on the exposed sidewalls of the trench in a self-aligned fashion. The trench bottom oxide is then stripped, thereby forming a curved gate channel.

7 Claims, 7 Drawing Sheets

US 7,592,229 B2

METHOD FOR FABRICATING A RECESSED-GATE MOS TRANSISTOR DEVICE

BACKGROUND OF THE INVENTION

1. Field of the Invention

The present invention relates generally to method of fabricating a semiconductor device and, more particularly, to a method for fabricating a recessed-gate metal-oxide-semiconductor (MOS) transistor device having a self-aligned arc-shaped trench bottom channel.

2. Description of the Prior Art

With the continuing shrinkage of device feature size, the so-called short channel effect (SCE) due to shrunk gate channel length has been found that it can hinder the integrity of integrated circuit chips. Many efforts have been made for solving this problem, for example, by reducing the thickness of the gate oxide dielectric or by increasing the doping concentration of source/drain. However, these approaches adversely affect the device reliability and speed of data transfer on the other hand, and are thus impractical.

A newly developed recessed-gate MOS transistor becomes most promising. In the filed of Dynamic Random Access Memory (DRAM), the recessed-gate technology may be used to improve the integrity of the memory chip. Typically, the recess-gate MOS transistor has a gate insulation layer formed on sidewalls and bottom surface of a recess etched into a substrate, a conductive filling the recess, contrary to a planar gate type transistor having a gate electrode formed on a planar surface of a substrate.

However, the aforesaid recess-gate MOS transistor has some shortcomings. For example, the recess for accommodating the gate of the MOS transistor is etched into a semiconductor wafer by using conventional dry etching methods. It is so difficult to form recesses having the same depth across the wafer that a threshold voltage control problem arises. Further, as the width of the recess shrinks, the channel length is reduced, resulting in short channel effect.

SUMMARY OF THE INVENTION

It is one object of this invention to provide a method of fabricating a recess-gate MOS transistor device having a self-aligned arc-shaped channel at trench bottom in order to solve the above-mentioned problems.

According to the claimed invention, a method of fabricating a recess-gate transistor device is disclosed. A semiconductor substrate is provided. A gate trench is etched into the semiconductor substrate. The gate trench comprises a trench bottom and a trench sidewall. A spacer comprising a polysilicon layer is formed on the trench sidewall. A trench bottom oxide layer is formed at the trench bottom. The spacer is removed to expose the trench sidewall. A source/drain diffusion region is doped into the trench sidewall. An insulating mask layer is formed on the trench sidewall. The trench bottom oxide layer is removed to form an arc-shaped trench bottom. A gate dielectric layer is formed on the arc-shaped trench bottom. The gate trench is then filled with conductive gate material.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
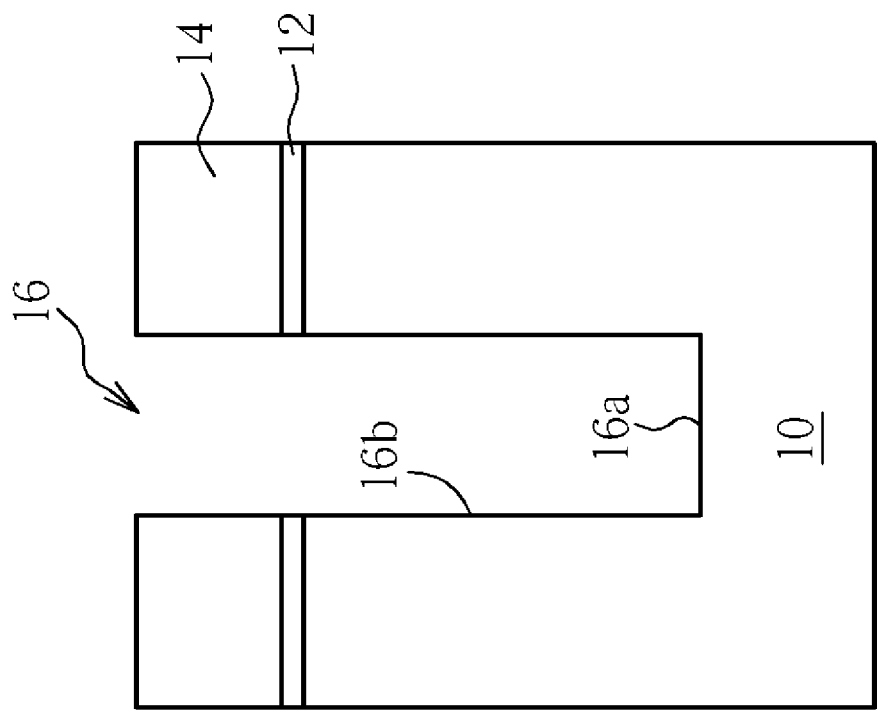
FIGS. 1-7 are schematic, cross-sectional diagrams illustrating a method of fabricating a recess-gate MOS transistor in accordance with one preferred embodiment of this invention.

FIGS. 1-7 are schematic, cross-sectional diagrams illustrating a method of fabricating a recess-gate MOS transistor in accordance with one preferred embodiment of this invention. As shown in FIG. 1, a semiconductor substrate 10 such as a silicon substrate, silicon epitaxial substrate or Silicon-On-Insulator (SOI) substrate is provided. A pad oxide layer 12 is then formed on the main surface of the semiconductor substrate 10. A pad nitride layer 14 is then deposited on the pad oxide layer 12.

The aforesaid pad oxide layer 12 may be formed by conventional thermal oxidation methods or Chemical Vapor Deposition (CVD) methods. Preferably, the pad oxide layer 12 has a thickness of about 10-500 angstroms. The pad nitride layer 14 may be formed by low-pressure CVD methods or other CVD methods. The pad nitride layer 14 has a thickness of about 500-5000 angstroms.

Subsequently, a lithographic and etching process is carried out to form a gate trench 16 in the semiconductor substrate 10. The gate trench 16 has a trench bottom 16a and trench sidewall 16b. The aforesaid lithographic and etching process generally comprises the steps of forming a photoresist layer on the pad nitride layer 14, exposing the photoresist layer to light, developing the photoresist layer to form an opening therein, etching the exposed pad nitride layer 14, the pad oxide layer 12 and the semiconductor substrate 10 via the opening, thereby forming the gate trench 16. The photoresist layer is then stripped off.

Figure 2:
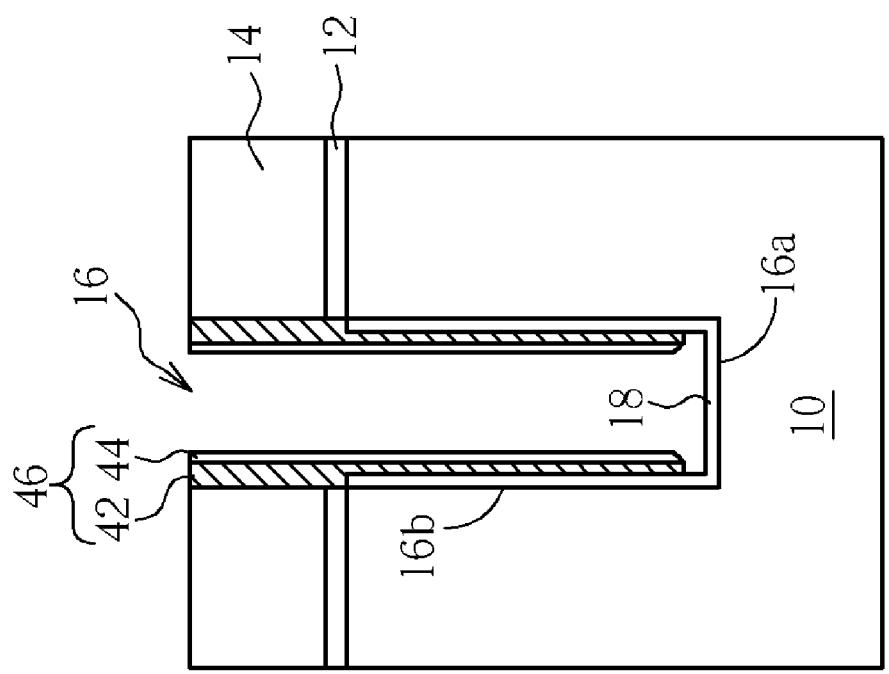

As shown in FIG. 2, after the formation of the gate trench 16, an oxidation process is performed to form a thin silicon oxide layer 18 on both the trench bottom 16a and the trench sidewall 16b. Preferably, the thin silicon oxide layer 18 has a thickness of about 10-500 angstroms. Thereafter, a conformal polysilicon layer 42 is deposited on the pad nitride layer 14 and covers the trench sidewall 16b and trench bottom 16a. A thin silicon nitride layer 44 is then deposited on the conformal polysilicon layer 42. An anisotropic dry etching process is carried out to etch the thin silicon nitride layer 44 and exposes the underlying polysilicon layer 42 at the trench bottom 16a. An isotropic etching process is then carried out to etch away the exposed polysilicon layer 42 at the trench bottom 16a to expose the underlying silicon oxide layer 18, thereby forming a polysilicon/nitride spacer 46 on trench sidewall 16b. The lateral etching of the polysilicon layer 42 at the trench bottom 16a leads to a reverse-T shaped gate trench 16.

Figure 3:
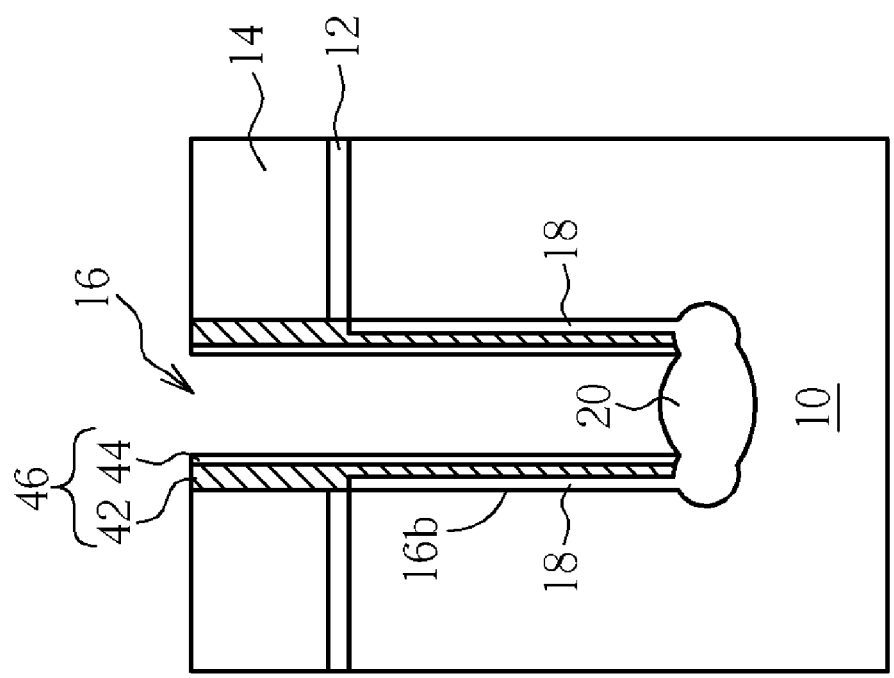

As shown in FIG. 3, using the polysilicon/nitride spacer 46 as a hard mask, a thermal oxidation process such as Localized Oxidation of Silicon (LOCOS) process is carried out to grow a trench bottom oxide layer 20 at the exposed trench bottom 16a of the gate trench 16. The trench sidewall 16b is masked and protected by the polysilicon/nitride spacer 46.

It is one salient feature that the lower portion of the polysilicon layer 42 of the polysilicon/nitride spacer 46 alleviates so-called bird's beak effect during the aforesaid thermal oxidation process for the formation of the trench bottom oxide layer 20. The polysilicon layer 42 of the polysilicon/nitride spacer 46 stops the over-oxidation of the lower portion of the trench sidewall 16*b* during the thermal oxidation.

Figure 4:
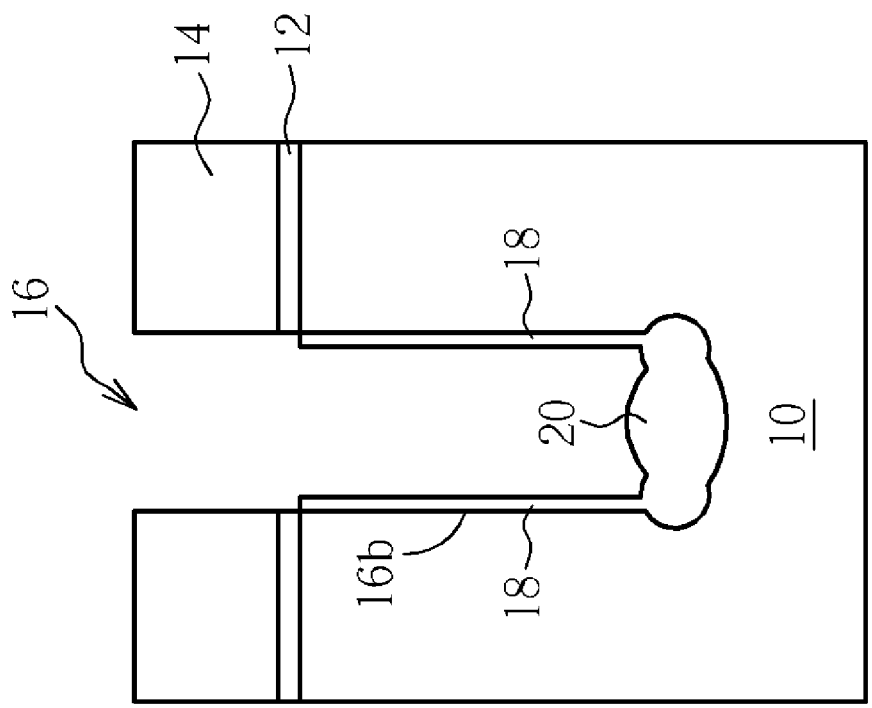

As shown in FIG. 4, the polysilicon/nitride spacer 46 on the trench sidewall 16*b* of the gate trench 16 is removed to expose the thin silicon oxide layer 18. The polysilicon/nitride spacer 46 may be removed by conventional wet etching process such as heated phosphoric acid solution for removing the nitride and ammonia solution for removing polysilicon, but not limited thereto. Optionally, the silicon oxide layer 18 on the trench sidewall 16*n* is removed after removing the polysilicon/nitride spacer 46.

Figure 5:
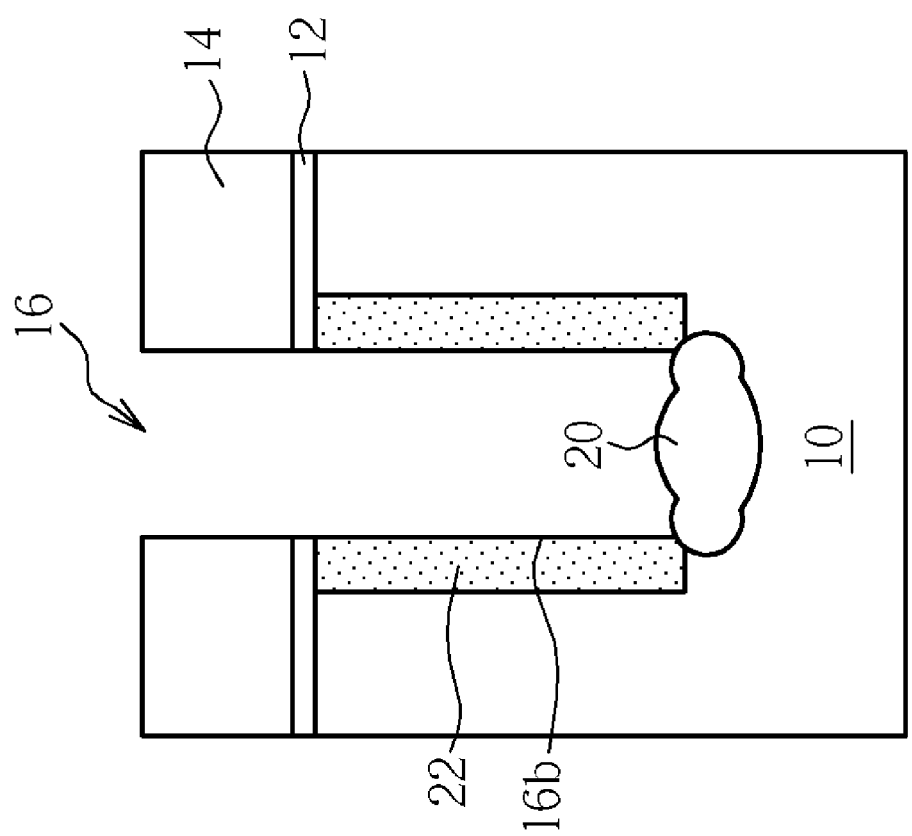

As shown in FIG. 5, a source/drain diffusion region 22 is formed on the trench sidewall 16*b* of the gate trench 16. To form the source/drain diffusion region 22, a conventional Gas-Phase Diffusion (GPD) may be employed. Alternatively, the source/drain diffusion region 22 may be formed by first depositing a doped silicate glass such as Phosphorus-doped Silicate Glass (PSG), Arsenic-doped Silicate Glass (ASG) or Boron-doped Silicate Glass (BSG), followed by thermal drive-in. In another case, the source/drain diffusion region 22 may be formed by tilt-angle ion implantation methods.

Figure 6:
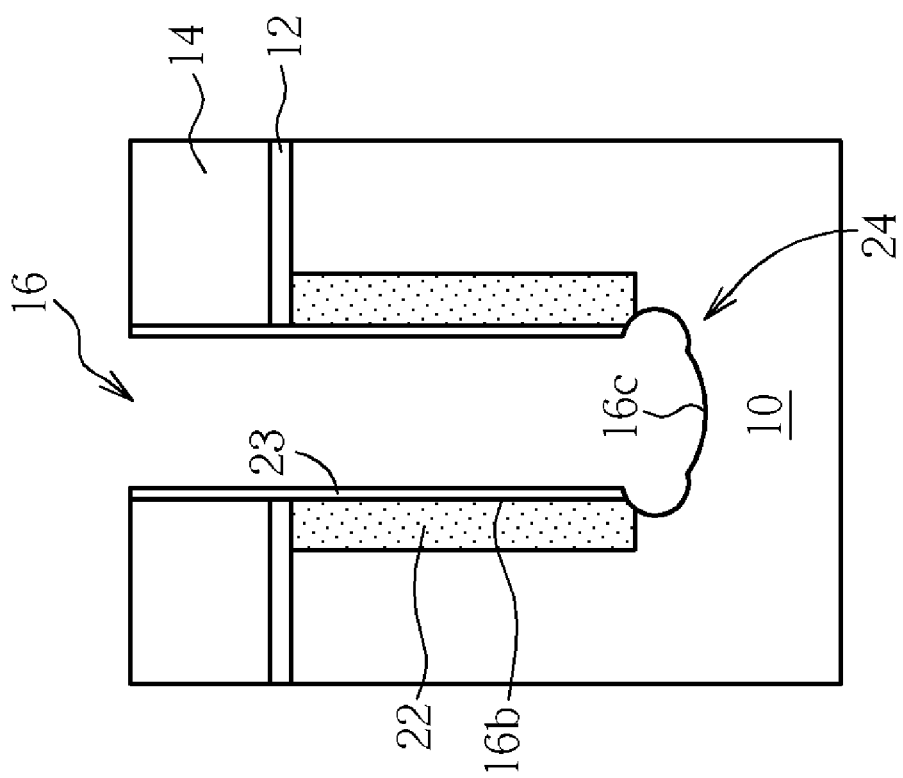

As shown in FIG. 6, after the formation of the source/drain diffusion region 22, a silicon nitride spacer 23 is then formed on the trench sidewall 16*b*. The silicon nitride spacer 23 covers the source/drain diffusion region 22 and exposes the trench bottom oxide layer 20. An etching process is then carried out to remove the trench bottom oxide layer 20, thereby forming an arc-shaped trench bottom 16*c* in the gate trench 16 and an extended, curved channel region 24 between the source/drain diffusion regions 22. The etching process for removing the trench bottom oxide layer 20 may be conventional wet etching processes such as diluted HF, but not limited thereto.

The aforesaid silicon nitride spacer 23 may be formed by first depositing a conformal silicon nitride layer that covers the pad nitride layer 14, the trench sidewall 16*b* and the trench bottom oxide layer 20, then anisotropically dry etching the silicon nitride layer to remove the silicon nitride layer that covers the pad nitride layer 14 and trench bottom oxide layer 20.

Figure 7:
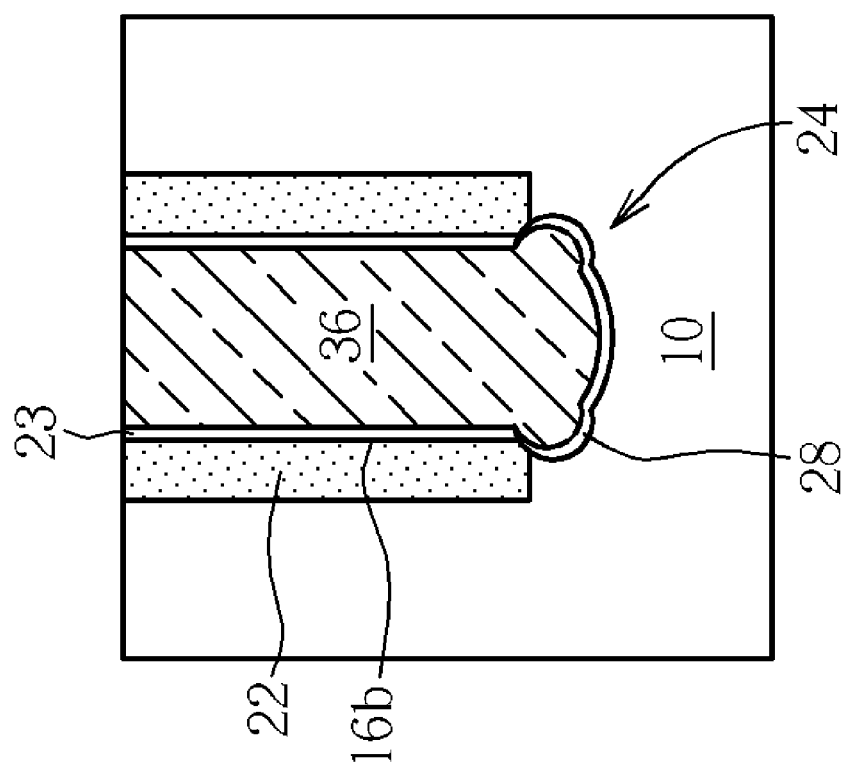

As shown in FIG. 7, on the exposed arc-shaped trench bottom 16*c* in the gate trench 16, a gate oxide layer 28 is formed. According to the preferred embodiment of this invention, the gate oxide layer 28 is formed by In-Situ Steam Growth (ISSG) method, but not limited thereto. Preferably, the gate oxide layer 28 has a thickness of about 10-500 angstroms.

Finally, the gate trench 16 is filled with conductive gate material 36 such as doped polysilicon. Preferably, a Chemical Mechanical Polishing (CMP) is performed to remove excess conductive gate material 36 outside the gate trench 16.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a recess-gate transistor device, comprising:

providing a semiconductor substrate having thereon a gate trench etched into said semiconductor substrate, and said gate trench comprising a trench bottom and a trench sidewall;

forming, on the trench sidewall, a spacer comprising a polysilicon layer;

forming a trench bottom oxide layer at said trench bottom;

removing said spacer to expose said trench sidewall;

forming a source/drain diffusion region on said trench sidewall;

forming an insulating mask layer on said trench sidewall after forming the source/drain diffusion region;

removing said trench bottom oxide layer to form an arc-shaped trench bottom after forming the insulating mask layer;

forming a gate dielectric layer on said arc-shaped trench bottom; and filling said gate trench with conductive gate material after forming the gate dielectric layer.

2. The method according to claim 1 wherein said trench bottom oxide layer is formed by Localized Oxidation of Silicon (LOCOS) method.

3. The method according to claim 1 wherein said source/drain diffusion region is doped by Gas-Phase Diffusion (GPD) method.

4. The method according to claim 1 wherein said source/drain diffusion region is doped by tilt-angle ion implantation method.

5. The method according to claim 1 wherein said gate dielectric layer is formed by In-Situ Steam Growth (ISSG) method.

6. The method according to claim 1 wherein the conductive gate material comprises doped polysilicon.

7. The method according to claim 1 wherein said polysilicon layer of said spacer alleviates bird's beak effect during the formation of the trench bottom oxide layer.

\* \* \* \* \*